(12) United States Patent
Jiang et al.

(10) Patent No.: US 11,209,127 B2
(45) Date of Patent: Dec. 28, 2021

(54) FLEXIBLE FILAMENT LED APPARATUS

(71) Applicant: XIAMEN ECO LIGHTING CO. LTD., Xiamen (CN)

(72) Inventors: Hongkui Jiang, Xiamen (CN); Qingyue Liao, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/701,876

(22) Filed: Dec. 3, 2019

(65) Prior Publication Data

US 2020/0182413 A1    Jun. 11, 2020

Related U.S. Application Data

(60) Provisional application No. 62/774,342, filed on Dec. 3, 2018.

(51) Int. Cl.
| | |
|---|---|
| *F21K 9/232* | (2016.01) |
| *F21S 4/26* | (2016.01) |
| *H05B 45/20* | (2020.01) |
| *H05B 45/30* | (2020.01) |

(52) U.S. Cl.
CPC ............... *F21K 9/232* (2016.08); *F21S 4/26* (2016.01); *H05B 45/20* (2020.01); *H05B 45/30* (2020.01)

(58) Field of Classification Search
CPC .. F21K 9/232; F21K 9/238; F21S 4/26; F21V 23/0435
See application file for complete search history.

(56) References Cited

U.S. PATENT DOCUMENTS

| | | | |
|---|---|---|---|
| 2016/0041324 A1* | 2/2016 | Nava | F21K 9/61 362/311.01 |
| 2016/0377237 A1* | 12/2016 | Zhang | H01L 33/62 362/311.02 |
| 2017/0227169 A1* | 8/2017 | Jiang | F21K 9/235 |
| 2018/0135819 A1* | 5/2018 | Grandadam | F21V 23/0435 |
| 2019/0139943 A1* | 5/2019 | Tiwari | F21K 9/232 |

* cited by examiner

*Primary Examiner* — Joseph L Williams
(74) *Attorney, Agent, or Firm* — Chun-Ming Shih; HDLS IPR Services

(57) ABSTRACT

An LED light apparatus includes a core column, a flexible filament, a mode switch, a driver, a bulb shell and a bulb cap. The flexible filament has multiple LED modules and the core column has a central bar to support the flexible filament. The mode switch is provided for a user to select one selected mode from multiple modes manually.

18 Claims, 7 Drawing Sheets

FLEXIBLE FILAMENT LED APPARATUS

FIELD

The present invention is related to a LED apparatus and more particularly related to a flexible filament LED apparatus.

BACKGROUND

LED (Light Emitted Diode) devices are popular but people still look for better and interesting LED devices. When light devices are so important in modern life, every improvement brings vast impact and effect.

Nowadays, LED technologies keep spreading to various traditional light devices. Furthermore, by using the advantages of the LED, more interesting devices may be developed compared with traditional fluorescent light devices and incandescent light devices.

SUMMARY

In an embodiment, an LED light apparatus includes a core column, a flexible filament, a mode switch, a driver, a bulb shell and a bulb cap.

The core column has a central bar and a base. The central bar is extended above the base. The flexible filament is mounted with multiple LED modules, supported and bent by the central bar for forming a three-dimension light source. The mode switch is provided for a user to select one selected mode from multiple modes manually.

The driver is electrically connected to the mode switch for driving the multiple LED modules of the flexible filament differently according the selected mode.

The bulb shell defines a container for storing the flexible filament and the central bar. The bulb cap is connected to the bulb shell.

In some other embodiments, the core column and the central bar are not necessary while the flexible filament is extended by its flexibility in the bulb shell.

In some embodiments, the mode switch comprises an electronic switch receiving an instruction of an external device.

In some embodiments, the mode switch includes a manual switch to be independently operated even when the electronic switch does not receive the instruction.

In some embodiments, the instruction received by the electronic switch controls the driver to drive the multiple LED modules to turn on or turn off forming a corresponding image pattern.

In some embodiments, the mode switch is a sliding switch for determining a mixed color temperature of the multiple LED modules.

In some embodiments, the flexible filament has a flexible substrate mounted with the plurality of LED modules.

In some embodiments, the flexible substrate has a thickness enough for keeping a bending shape while no external force is applied to the flexible substrate.

In some embodiments, the multiple LED modules are connected in series as a series string, and the series string is routed so that two ends of the series string are at the same side of the filament.

In some embodiments, the filament has a hook structure electrode to be plugged to a corresponding socket for receiving a driving current.

In some embodiments, the LED light apparatus of claim 1 also includes heat dissipation gas filled in the container of the bulb shell.

In some embodiments, the filament includes two strings of LED modules with different color temperatures connected in parallel.

In some embodiments, the central bar is a Y shape structure for holding the filament.

In some embodiments, the LED light apparatus of claim 1 also includes a light guide and a second light source for adding light to the filament.

In some embodiments, the central bar is made of a transparent material.

In some embodiments, the central bar and the base are made of an unibody component.

In some embodiments, the unibody component is made of glass.

In some embodiments, a reflective material is attached on a surface of the central bar for enhancing light effect.

In some embodiments, the filament comprises a substrate and two fluorescent layers attached on two sides of the substrate, and thicknesses of the two fluorescent layers are not the same.

In some embodiments, the substrate is transparent and the thicknesses of the two fluorescent layers are controlled to keep light from both sides of the filament has substantially the same luminous level.

In some embodiments, there are more than two filaments with different color temperatures twisted together.

DETAILED DESCRIPTION OF EMBODIMENTS

The present invention provides several aspects of LED light apparatuses with flexible filaments. In the following disclosure, a general model is explained first and several aspects are provided thereafter. The improvements and alternative options may be combined in any way to implement various complete LED light devices.

Figure 1:
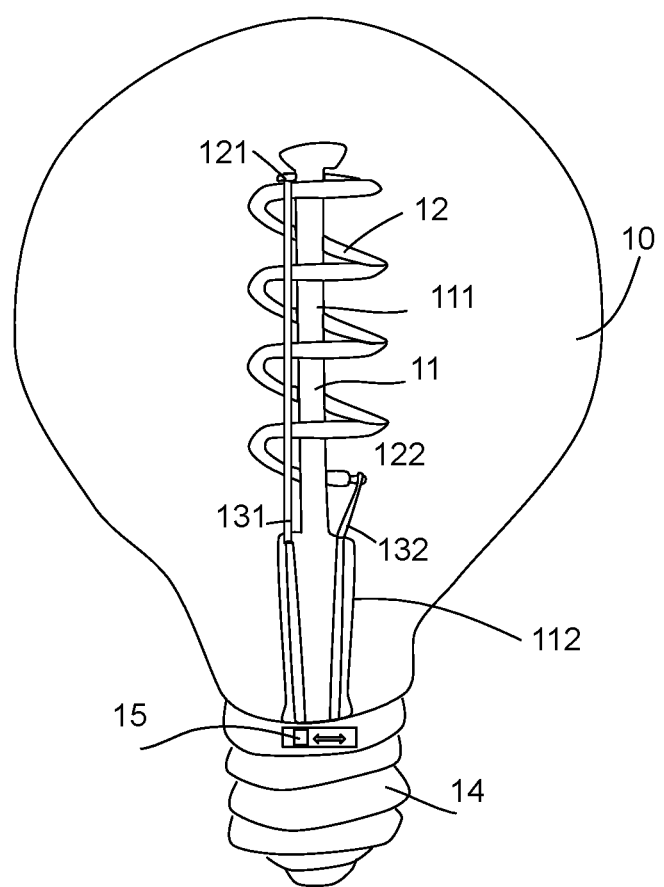
FIG. 1 illustrates a LED light apparatus with a flexible filament.

Please refer to FIG. 1, which illustrates a LED light apparatus with a flexible filament.

In FIG. 1, a light bulb includes a bulb cap 14, a bulb shell 10, a mode switch 15, a core column 112, and a flexible filament 12.

In this embodiment, the flexible filament 12 is bent to surround a central bar 111 of a core column 11, forming a three-dimension light source module for emitting light in directions across a three-dimension space. The flexible filament 12 is mounted with a plurality of LED chips. These LED chips are wired in series, in parallel, or in series and in parallel, or as multiple independent series of LED devices.

The central 111 is connected to a base 112 of the core column 11. In some embodiments, the central bar 111 and the core column 112 are both made of glass material and made as the same unibody structure.

There is a tube disposed in the base 112 of the core column for filling heat dissipation gas into a sealing space formed by the bulb shell 10 and the base 112.

In some embodiments, the gas may include Argon, Helium, Oxygen. For example, the Argon may occupy more than 30% of the overall filled gas. In some other alternatives, the Oxygen may be more than 1% of overall filled gas. In some other embodiments, the Helium may occupy more than 40% of overall filled gas.

In this example, two ends 121, 122 of the flexible filament 12 are connected to two conductor bars 131, 132.

In this example, there is a mode switch 15. Users may operate the mode switch 15 to one of predetermined positions. Each position may correspond a different setting of the flexible filament 12. For example, the flexible filament 12 may include different LED chips or covered with different fluorescent layers for generating different optical spectrums or color temperatures. By operating the mode switch 15, the driver detects the mode of the mode switch 15, whether the mode switch 15 is a mechanic switch or an electronic switch, and drives the filament 12 to generate corresponding light of predetermined optical characteristic.

In some other embodiments, there may be more than one filaments disposed in the bulb shell. These filaments may have the same optical characteristic or have different optical characteristics. These filaments may be controlled separately, or together. Alternatively, multiple filaments may be operated in one of several predetermined modes corresponding to several predetermined scenes that may be set during manufacturing, or configured via a wire or wireless circuit via an external device like a mobile phone.

Figure 2:
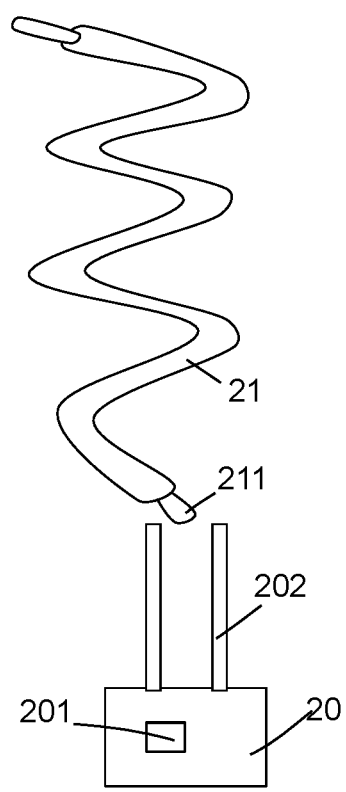
FIG. 2 illustrates a flexible filament example.

Please refer to FIG. 2. In FIG. 2, a flexible filament 21 is illustrated. The terminal 211 of the flexible filament 21 may be welded to electrically connect to a terminal 202 of a driver circuit board 20. Alternatively, the terminal 211 of the flexible filament 21 may be made with a socket or other plugging structure so that the terminal 211 of the flexible filament 21 may be plugged to a corresponding plugging structure of the terminal 202 of the driver circuit board 20.

In some embodiments, the driver circuit board 20 may have a wireless circuit 201 for communicating with an external device like a mobile phone or a remote control. The wireless circuit 201 may also be replaced with other wire or wireless communication circuit.

Figure 3A:
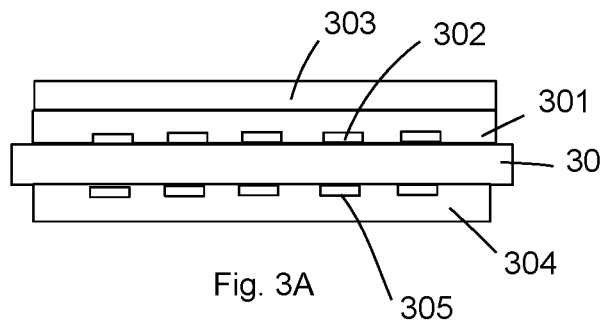
FIG. 3A illustrates a flexible filament.

In FIG. 3A, a flexible filament may include a flexible substrate 30. The flexible filament may have LED chips on only one side. In this example, the flexible filament has LED chips 302, 305 on both sides of a flexible substrate 30. There may be a first fluorescent layer 301 covering the LED chip 302. There may be a second fluorescent layer 303 covering the first fluorescent layer 301. The light emitted from the LED chips 302 passes through the first fluorescent layer 301 and the second fluorescent layer 302 to be converted into desired optical spectrum composition. In addition, the interface between the first fluorescent layer 301 and the second fluorescent layer 303 may have a lot of micro lens, which appear with a lot of concave structures along the interface between the first fluorescent layer 301 and the second fluorescent layer 303. Such micro lens, under experiments, cause better optical result. One way to achieve such effect is attaching the second fluorescent layer 303 to the first fluorescent layer 301 when the first fluorescent layer 301 is not rigid yet.

In addition, the LED chips 302, there are additional LED chips 305 on the back side of the flexible substrate 30. There may be a third fluorescent layer 304 applied on the back side of the flexible substrate 30, covering the additional LED chips 305 on the back side.

Figure 3B:
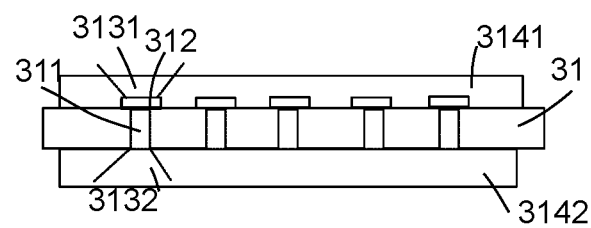
FIG. 3B illustrates light passing channels disposed on the flexible substrate.

In FIG. 3B, there are light passing channels 311 disposed on the flexible substrate 31. The LED chip 312 is disposed on the light passing channel 311, so that the light emitted from the LED chip 312 may emit upwardly 3131 or backwardly 3132 to the back side of the flexible substrate 31. Fluorescent layers 3141, 3142 are attached to two sides of the flexible substrate 31 respectively. The two fluorescent layers 3141, 3142 may have the same composition, or may have different composition, causing different optical output. The thickness of the two fluorescent layers 3141, 3142 may be different, when light amount passing through the light passing channel 311 may be less. By adjusting the thickness of the fluorescent layers 3141, 3142, the overall brightness level of the two sides of the flexible filament may be similar.

Figure 3C:
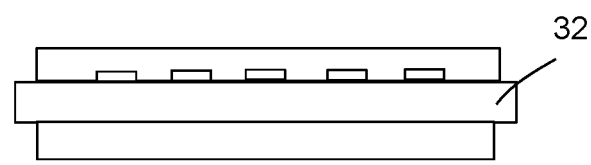
FIG. 3C illustrates another embodiment of a filament.

In FIG. 3C, the flexible substrate 32 is transparent or at least allowing light passing through. In such case, both sides of the flexible filament may emit light, forming a good visual effect.

In addition to apply fluorescent layer on the front side and the back side of a flexible substrate, the lateral side may also be attached with an additional fluorescent layer, which may improve overall appearance, so as to hide a metal lateral side, and also converts leak light to desired optical spectrum, increasing overall light efficiency.

Figures 4A, 4B:
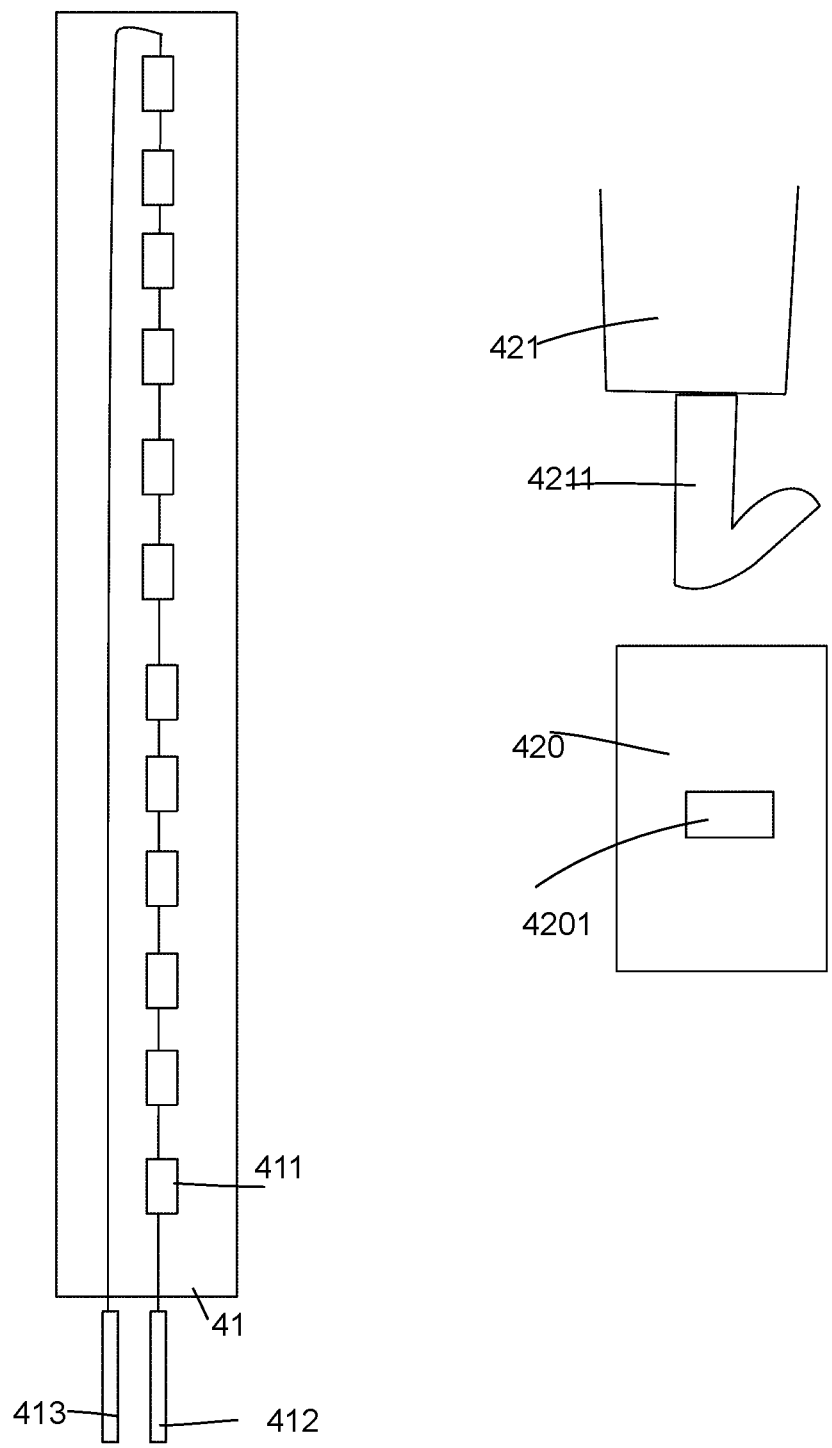
FIG. 4A illustrates multiple LED chips \ connected in series and disposed over a substrate.
FIG. 4B illustrates that a flexible filament has a hook structure electrode.

In FIG. 4A, multiple LED chips 411 are connected in series and disposed over a substrate 41. In some other embodiments, LED chips connected in series may be connected two opposite ends respectively connecting to a power supply. In this case, the two ends 412, 413 are both directed to the same side of a flexible filament. Compared with the embodiment of FIG. 1, in which the filament is connected on opposite sides for connecting to a power source, the example of FIG. 4A may be easier and more convenient to be installed. For example, there would be no need to provide a vertical conductor bar to electrically connect to the top end of the flexible filament. Therefore, the top side of the flexible filament may be disposed with a ring to be hooked on the top side of a core column. There may be various ways to dispose such flexible filaments.

For example, there may be multiple flexible filaments disposed in a bulb shell. These flexible filaments may be even connected in series, in parallel, or in series and in parallel, to achieve different visual and light effect.

As mentioned above, the flexible filament may have two electrode ends to be connected to a power supply. These electrode ends may be welded to corresponding terminals of a driver circuit. Alternatively, these electrode ends may have a plugging structure corresponding to a plugging structure of the electrode terminal of a driver circuit.

In FIG. 4B, the flexible filament 421 has a hook structure electrode 4211. The hook structure electrode 4211 may be inserted and locked in a corresponding socket 4201 of an electrode terminal 420 of a driver circuit. In this case, the male part is placed on the flexible filament 421 and the female part is placed on the electrode terminal of a driver circuit. In some other embodiments, these may be reversed, once such mechanism fixes the two components together.

Such structure may simplify assembling procedure in a factory. For example, workers only need to plug two ends of the flexible filament in corresponding sockets not only to fix the flexible filament but also to achieve electrical connection to a driver circuit.

In addition, some driver circuits like protection circuits including resistor, capacitor, and other protection circuits may be also disposed on the flexible filament, and even be covered by fluorescent layer for better appearance. By distributing driver components into the flexible filament, heat dissipation and size of the LED apparatus may be made even smaller and meanwhile, the assembling process is even more efficient.

Figures 5A, 5B:
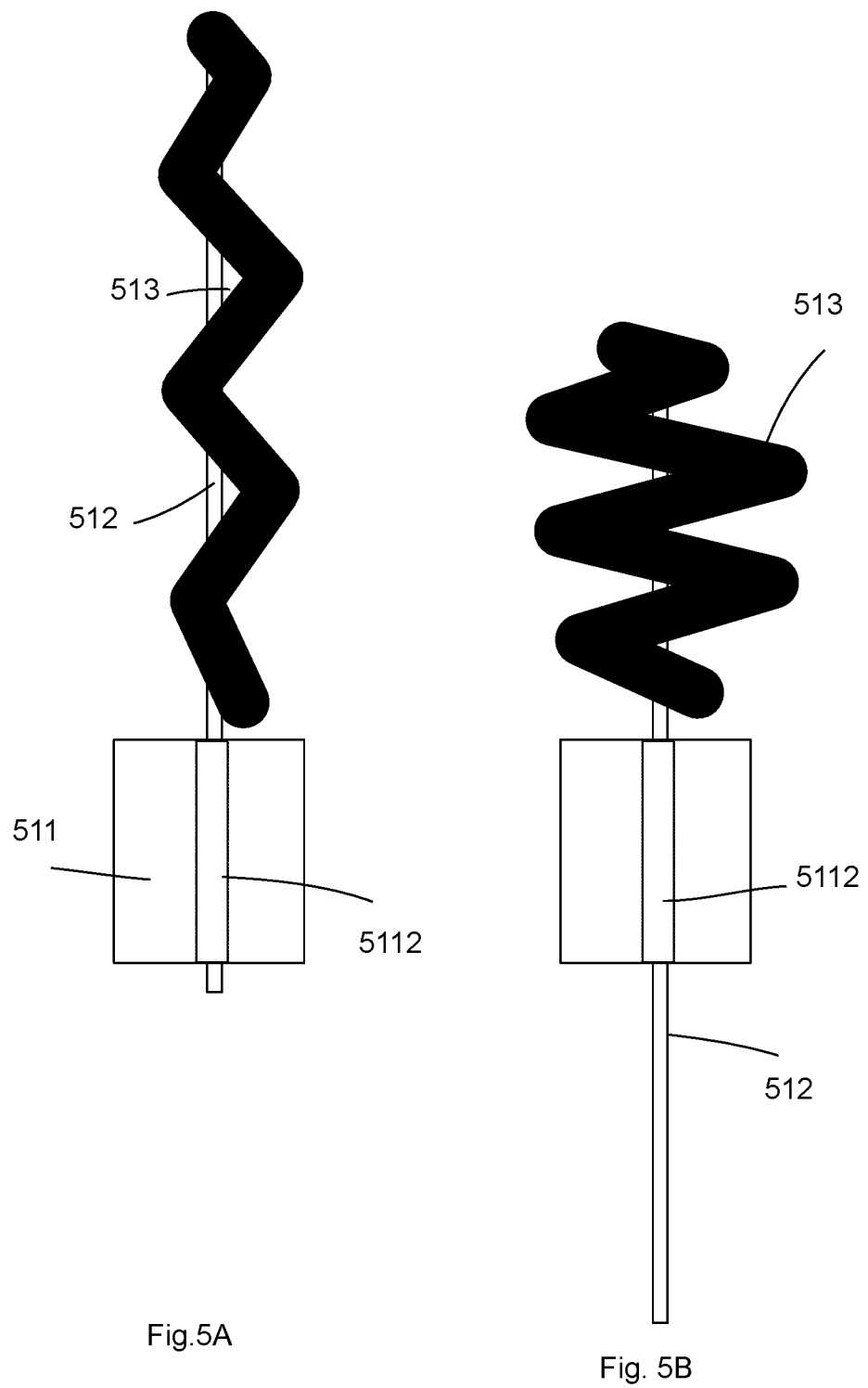
FIG. 5A and FIG. 5B illustrate an expanding structure to further expand the occupying space in a three-dimension space

FIG. 5A and FIG. B illustrate an expanding structure to further expand the occupying space in a three-dimension space, i.e. to further increase the spanning of the flexible filament.

In FIG. 5A, the base 511 of a core column has a channel 5112 for inserting a vertical bar 512 used for hanging a flexible filament 513. During manufacturing, the flexible filament 513 is firstly kept in small spanning width as illustrated in FIG. 5A.

The module of FIG. 5A makes it easier to enter an entrance hole of a light bulb shell. After the module of FIG. 5A enters the light bulb shell, as illustrated in FIG. 1, the vertical bar 512 is dragged to expand the flexible filament 512. In other words, the spanning width of the flexible filament may be larger than the entrance hole of a light bulb shell. This makes a better overall light distribution.

Other expanding structure may be designed to help achieve the same result, for example, the flexible filament may be firstly wrapped by a band to downside its spanning width to enter the entrance hole of a bulb shell. After the flexible filament enters the bulb shell, the band is released to expand the flexible filament which has certain elastic force.

Figure 6A:
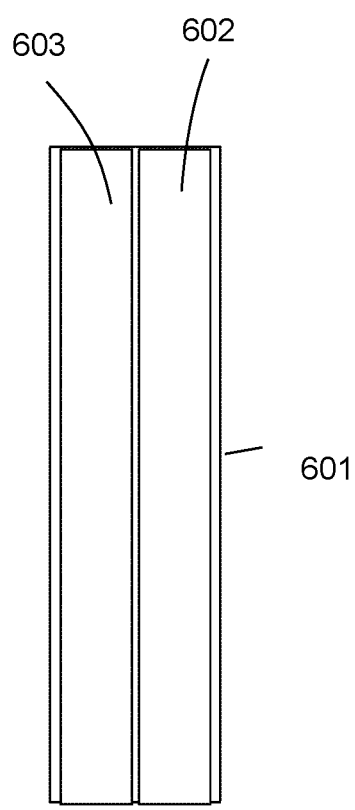
FIG. 6A illustrates that there are two parallel sections disposed on a flexible substrate.

Please see FIG. 6A. In FIG. 6A, there are two parallel sections 602, 603 disposed on a flexible substrate 601. The two parallel sections 602, 603 may provide light with different optical parameters, e.g. different colors, different color temperatures.

The two parallel sections 602, 603 may be made of attaching different fluorescent materials above the same LED chips, attaching same fluorescent materials on different LED chips, or attaching different fluorescent materials on different LED chips.

In some embodiments, the flexible substrate may be made of a flexible printed circuit board, which may be bent to desired shape. In some other embodiments, the flexible substrate of the flexible filament may be made of mixed material of aluminum and ceramic, or aluminum and graphene. By using such material, the flexible substrate may not only be capable of bending but also keeping a bending shape while external force is released.

In some other embodiments, in addition to use flexible-rigid material like aluminum and ceramic, making the bendable shape kept in last status, certain additional structure may be attached to the flexible substrate. For example, an aluminum or copper strip may be attached to the flexible filament to ensure the flexible filament kept its bending shape after an external force to bend the flexible filament is removed.

When there are multiple flexible filaments with different optical parameters, or one flexible filaments with several parts as illustrated in FIG. 6A with different optical parameters, the overall light parameters may be obtained by mixing these optical parameters.

For example, the two parallel sections 602, 603 in FIG. 6A may be controlled separately, by controlling their driving currents separately. The result may be a changing overall mixed color temperature.

Figure 6B:
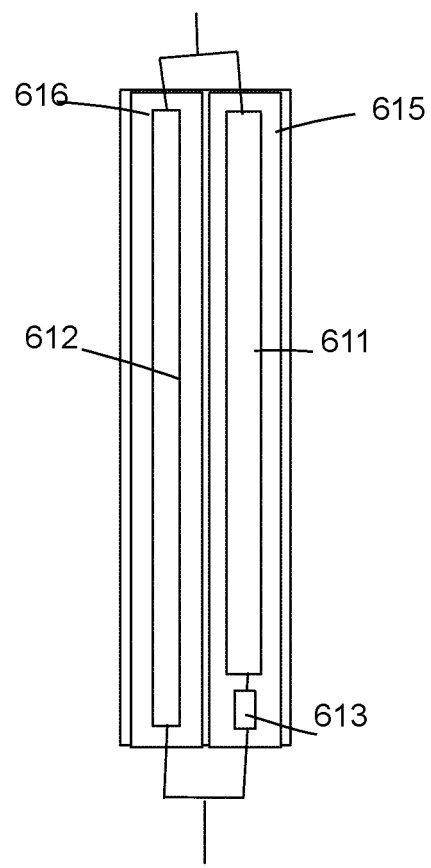
FIG. 6B illustrates that there are two LED strips with different color temperatures.

In FIG. 6B, there are two LED strips 611, 612 with different color temperatures. The two LED strips 611, 612 may each have multiple LED chips. Two different fluorescent layers 615, 616 attached over the two LED strips 611, 612 make the two LED strips 611, 612 provide different color temperatures. By adjusting the luminous levels of the two LED strips 611, 612, a different overall color temperature is provided.

In the example of FIG. 6B, a resistor 613 is electrically connected in series with the LED strip 611 before the LED strip 611 is connected in parallel with the LED strip 612. Such design makes the color temperature changes like sun light pattern. Specifically, when the overall luminous level of both the LED strips 611, 612 are adjusted larger, the overall color temperature is close to the color temperature of noon time. Otherwise, the overall color temperature is close to the color temperature of sunset. Such design is simple and low-cost solution to achieve such goal. This design may be used in the applications mentioned here.

Figure 7A:
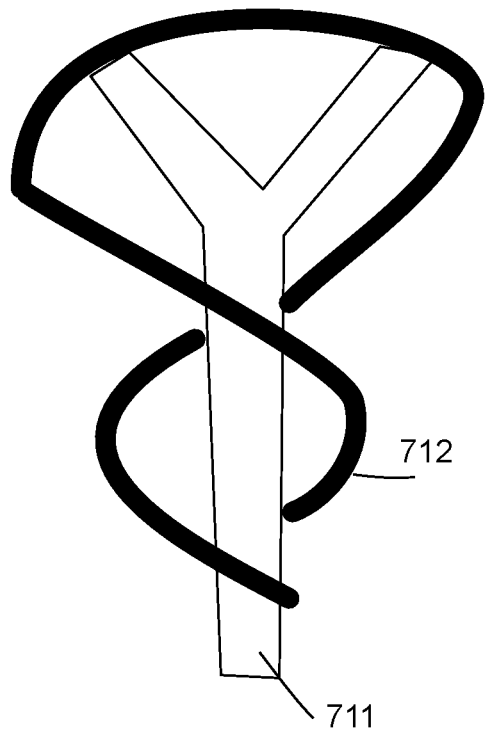
FIG. 7A illustrates a flexible filament supported by a Y shape column.

Please refer to FIG. 7A. In FIG. 7A, a flexible filament 712 is supported by a Y shape column 711. Other support with expanding structures on lateral directions like FIG. 7A may be used. The Y shape column may be made of transparent material like glass to make better visual effect.

Figure 7B:
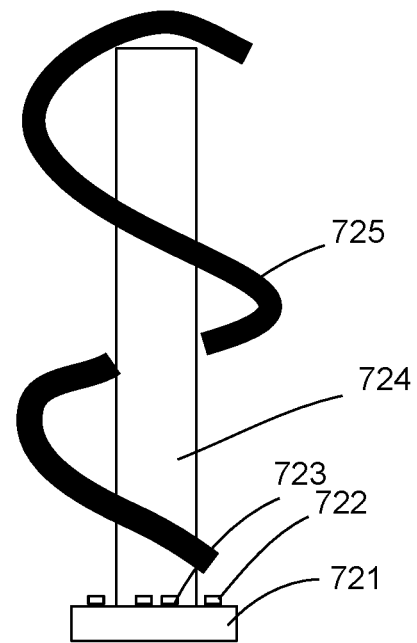
FIG. 7B illustrates a light guide that directs light emitted from a second light source may be added to flexible filament light apparatus.

In FIG. 7B, in addition to the flexible filament 725, a light guide 724 that directs light emitted from a second light source 723 may be added to flexible filament light apparatus.

In other words, there are two and maybe more than two light sources as illustrated in FIG. 7B. In this example, there may be a further light source 722 emitting light upwardly directly, not passing through the light guide 724.

The light guide 724 may be made of PMMA material, guiding light to enter through the PMMA material and escape from the light guide in surfaces with micro concave or convex structures.

The light source board 721 may be used to mount both the light sources 722, 723 or only one of them.

In addition to the illustrated embodiments above, there may be some further variations of the present invention depending on different design requirements.

For example, the inner surface of the light bulb shell may be attached with a heat dissipation layer for enhancing heat dissipation.

For example, the inner surface or external surface of the light bulb shell may be attached with a protection layer to absorb certain blue light to protect human eyes, while some studies show that blue light cause certain problems to human eyes. Such protection layer may select common absorbing material for absorbing or filtering blue light in certain amount.

For example, the inner surface or external surface of the light bulb shell may be attached with light diffusion layer, to decreasing glazing problem while human eyes look at the light apparatus.

For example, the driver circuit may be mounted on a driver circuit board. The driver circuit board may be provided with two terminals with plugging structure corresponding to plugging structures of the flexible filament exposed outside the combination of the bulb shell and the core column as illustrated in FIG. 1 for simplifying assembling of the driver circuit and the flexible filament.

Usually, those who select such filament light apparatus seek peaceful mind. Therefore, the wavelengths of the flexible filament would be preferred, in some embodiments, to cover wave lengths for green plants to grow. Specifically, the wave lengths may cover 280-315 nm, 315-400 nm, 400-520 nm, 520-610 nm, 610-720 nm, and/or 720-1000 nm to achieve different plant growing purposes for leaf, flower, etc.

Antenna of a wireless circuit disposed on a driver circuit board may be extended or disposed in the flexible filament or other places inside the bulb shell to increase wireless communication signal quality. Such design is particularly helpful for increasing IoT (Internet of Things) applications.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. An LED light apparatus, comprising:
a core column having a central bar and a base, the central bar extended above the base;
a flexible filament mounted with multiple LED modules, supported and bent by the central bar for forming a three-dimension light source;
a mode switch comprising a manual switch for a user to select one selected mode from multiple modes manually;
a driver electrically connected to the mode switch for driving the multiple LED modules of the flexible filament differently according the selected mode;
a bulb shell defining a container for storing the flexible filament and the central bar; and
a bulb cap connected to the bulb shell for mounting the manual switch, wherein the central bar is made of a transparent material, wherein the central bar and the base are made of an unibody component.

2. The LED light apparatus of claim 1, wherein the mode switch comprises an electronic switch receiving an instruction of an external device.

3. The LED light apparatus of claim 2, wherein the manual switch is independently operated even when the electronic switch does not receive the instruction.

4. The LED light apparatus of claim 3, wherein the instruction received by the electronic switch controls the driver to drive the multiple LED modules to turn on or turn off forming a corresponding image pattern.

5. The LED light apparatus of claim 1, wherein the mode switch is a sliding switch for determining a mixed color temperature of the multiple LED modules.

6. The LED light apparatus of claim 1, wherein the flexible filament has a flexible substrate mounted with the plurality of LED modules.

7. The LED light apparatus of claim 1, wherein the flexible substrate has a thickness enough for keeping a bending shape while no external force is applied to the flexible substrate.

8. The LED light apparatus of claim 1, wherein the multiple LED modules are connected in series as a series string, and the series string is routed so that two ends of the series string are at the same side of the flexible filament.

9. The LED light apparatus of claim 1, wherein the flexible filament has a hook structure electrode to be plugged to a corresponding socket for receiving a driving current.

10. The LED light apparatus of claim 1, further comprising heat dissipation gas filled in the container of the bulb shell.

11. The LED light apparatus of claim 1, wherein the flexible filament comprises two strings of LED modules with different color temperatures connected in parallel.

12. The LED light apparatus of claim 1, wherein the central bar is a Y shape structure for holding the flexible filament.

13. The LED light apparatus of claim 1, further comprising a light guide and a second light source for adding light to the flexible filament.

14. The LED light apparatus of claim 1, wherein the unibody component is made of glass.

15. The LED light apparatus of claim 14, wherein a reflective material is attached on a surface of the central bar for enhancing light effect.

16. The LED light apparatus of claim 1, wherein the flexible filament comprises a substrate and two fluorescent layers attached on two sides of the substrate, and thicknesses of the two fluorescent layers are not the same.

17. The LED light apparatus of claim 16, wherein the substrate is transparent and the thicknesses of the two fluorescent layers are controlled to keep light from both sides of the flexible filament has substantially the same luminous level.

18. The LED light apparatus of claim 1, wherein there are more than two flexible filaments with different color temperatures twisted together.

* * * * *